(12) United States Patent
Kim et al.

(10) Patent No.: US 11,031,347 B2
(45) Date of Patent: Jun. 8, 2021

(54) SEMICONDUCTOR PACKAGES

(71) Applicant: Samsung Electronics Co., Ltd., Suwon-si (KR)

(72) Inventors: Young-lyong Kim, Anyang-si (KR); Hyun-soo Chung, Hwaseong-si (KR); Dong-hyeon Jang, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/381,319

(22) Filed: Apr. 11, 2019

(65) Prior Publication Data

US 2019/0237410 A1   Aug. 1, 2019

Related U.S. Application Data

(63) Continuation of application No. 15/869,517, filed on Jan. 12, 2018, now Pat. No. 10,438,899.

(30) Foreign Application Priority Data

Aug. 8, 2017  (KR) .................. 10-2017-0100440

(51) Int. Cl.
*H01L 23/552* (2006.01)
*H01L 23/538* (2006.01)
(Continued)

(52) U.S. Cl.
CPC .......... *H01L 23/552* (2013.01); *H01L 23/345* (2013.01); *H01L 23/367* (2013.01); *H01L 23/4334* (2013.01); *H01L 23/5384* (2013.01); *H01L 24/10* (2013.01); *H01L 24/19* (2013.01); *H01L 24/20* (2013.01); *H01L 23/49816* (2013.01); *H01L 23/5389* (2013.01); *H01L 24/13* (2013.01); *H01L 24/16* (2013.01); *H01L 24/17* (2013.01); *H01L 24/29* (2013.01);
(Continued)

(58) Field of Classification Search
None
See application file for complete search history.

(56) References Cited

U.S. PATENT DOCUMENTS 8,581,370 B2  11/2013  Pagaila et al.
8,861,221 B2  10/2014  Pagaila
(Continued)

FOREIGN PATENT DOCUMENTS

KR  10-1342829 B1  1/2014

OTHER PUBLICATIONS

U.S. Notice of Allowance dated May 30, 2019 issued in co-pending U.S. Appl. No. 15/869,517.

*Primary Examiner* — Anthony Ho
*Assistant Examiner* — Kevin Quinto
(74) *Attorney, Agent, or Firm* — Harness, Dickey & Pierce, P.L.C.

(57) ABSTRACT

A semiconductor package including a heat spreading layer having at least one hole, a first semiconductor chip below the heat spreading layer, a redistribution structure below the first semiconductor chip, a first mold layer between the heat spreading layer and the redistribution structure, a shielding wall extending from the redistribution structure and the heat spreading layer and surrounding the first semiconductor chip, and a first conductive pillar extending from the redistribution structure into the hole may be provided.

20 Claims, 14 Drawing Sheets

(51) Int. Cl.
H01L 23/00 (2006.01)
H01L 23/34 (2006.01)
H01L 23/367 (2006.01)
H01L 23/433 (2006.01)
H01L 25/065 (2006.01)
H01L 25/10 (2006.01)
H01L 23/498 (2006.01)

(52) U.S. Cl.
CPC .............. H01L 24/32 (2013.01); H01L 24/48 (2013.01); H01L 24/73 (2013.01); H01L 24/83 (2013.01); H01L 24/92 (2013.01); H01L 24/97 (2013.01); H01L 25/0657 (2013.01); H01L 25/105 (2013.01); H01L 2224/12105 (2013.01); H01L 2224/13025 (2013.01); H01L 2224/16146 (2013.01); H01L 2224/16227 (2013.01); H01L 2224/17181 (2013.01); H01L 2224/2919 (2013.01); H01L 2224/2929 (2013.01); H01L 2224/29339 (2013.01); H01L 2224/29344 (2013.01); H01L 2224/29347 (2013.01); H01L 2224/29355 (2013.01); H01L 2224/32145 (2013.01); H01L 2224/32245 (2013.01); H01L 2224/48227 (2013.01); H01L 2224/73204 (2013.01); H01L 2224/73267 (2013.01); H01L 2224/83851 (2013.01); H01L 2224/83862 (2013.01); H01L 2224/83874 (2013.01); H01L 2224/92244 (2013.01); H01L 2224/97 (2013.01); H01L 2225/06513 (2013.01); H01L 2225/06517 (2013.01); H01L 2225/06541 (2013.01); H01L 2225/06565 (2013.01); H01L 2225/1035 (2013.01); H01L 2225/1058 (2013.01); H01L 2225/1094 (2013.01); H01L 2924/1431 (2013.01); H01L 2924/1434 (2013.01); H01L 2924/15311 (2013.01); H01L 2924/3025 (2013.01); H01L 2924/3511 (2013.01)

(56) References Cited

U.S. PATENT DOCUMENTS

| | | | |
|---|---|---|---|
| 8,921,993 B2 | 12/2014 | Choi et al. | |
| 8,999,760 B2 | 4/2015 | Pagaila et al. | |
| 9,171,797 B2 | 10/2015 | Lin et al. | |
| 9,236,355 B2 | 1/2016 | Zhai et al. | |
| 9,324,672 B2 | 4/2016 | Pagaila | |
| 9,520,323 B2 | 12/2016 | Vincent et al. | |
| 9,553,052 B2 | 1/2017 | Matsubara et al. | |
| 9,570,406 B2 | 2/2017 | Deng et al. | |
| 9,589,909 B1 | 3/2017 | Yap et al. | |
| 9,620,463 B2 | 4/2017 | Kim et al. | |
| 9,659,878 B2 | 5/2017 | Chen et al. | |
| 2002/0074637 A1* | 6/2002 | McFarland | H01L 21/563 257/686 |
| 2004/0076562 A1 | 4/2004 | Manzanec et al. | |
| 2004/0212970 A1* | 10/2004 | Chen | H01L 21/565 361/764 |
| 2009/0236752 A1 | 9/2009 | Lee et al. | |
| 2009/0278219 A1* | 11/2009 | Morrison | H01L 27/14618 257/432 |
| 2011/0298109 A1* | 12/2011 | Pagaila | H01L 21/56 257/660 |
| 2012/0075821 A1* | 3/2012 | Pagaila | H01L 23/3157 361/783 |
| 2014/0124907 A1* | 5/2014 | Park | H01L 23/552 257/659 |
| 2014/0160699 A1* | 6/2014 | Zhang | H01L 23/552 361/752 |
| 2014/0183671 A1* | 7/2014 | Kuratani | H01L 23/552 257/416 |
| 2016/0073496 A1 | 3/2016 | Vincent | |
| 2016/0099212 A1 | 4/2016 | Vincent | |
| 2016/0172309 A1 | 6/2016 | Gong et al. | |
| 2016/0359100 A1 | 12/2016 | Bhushan et al. | |

* cited by examiner

SEMICONDUCTOR PACKAGES

CROSS-REFERENCE TO RELATED APPLICATION

This application is a continuation of U.S. application Ser. No. 15/869,517, filed on Jan. 12, 2018, which claims priority under 35 U.S.C. § 119 to Korean Patent Application No. 10-2017-0100440, filed on Aug. 8, 2017, in the Korean Intellectual Property Office, the disclosure of each of which is hereby incorporated by reference in its entirety.

BACKGROUND

1. Technical Field

Example embodiments of the present disclosure relate to semiconductor packages and, more specifically, to wafer level packages.

2. Discussion of Related Art

A semiconductor chip in a semiconductor package may malfunction due to electromagnetic interference (EMI). As electronic devices are downsized, a semiconductor package is highly integrated and downscaled. There are increasing demands for enhanced EMI shield and high heat dissipation performance in the highly integrated and downscaled semiconductor package.

SUMMARY

According to an example embodiment of the inventive concepts, a semiconductor package may include a heat spreading layer including a hole, a first semiconductor chip below the heat spreading layer, a redistribution structure below the first semiconductor chip, a first mold layer between the heat spreading layer and the redistribution structure, a shielding wall extending from the redistribution structure and the heat spreading layer and surrounding the first semiconductor chip, and a first conductive pillar extending from the redistribution structure into the hole.

According to an example embodiment of the inventive concepts, a semiconductor package may include a heat spreading layer including at least one chip portion, a shielding portion surrounding the at least one chip portion, and a hole portion outside the shielding portion and including a hole, at least one first semiconductor chip below the at least one chip portion of the heat spreading layer, at least one shielding wall in contact with and below the shielding portion of the heat spreading layer, a first conductive pillar passing through the hole included in the hole portion of the heat spreading layer, a second conductive pillar below the at least one first semiconductor chip, a first mold layer covering at least one sidewall of the shielding wall, a sidewall of the first conductive pillar, a sidewall of the at least one second conductive pillar, and a sidewall of the first semiconductor chip, and a redistribution structure below the first semiconductor chip and in contact with the at least one shielding wall, the first conductive pillar, and the second conductive pillar.

According to an example embodiment of the inventive concepts, a semiconductor package may include a first semiconductor package, a second semiconductor package on the first semiconductor package, and an inter-package connection between the first semiconductor package and the second semiconductor package. The first semiconductor package may include a redistribution structure, a first semiconductor chip on the redistribution structure, a heat spreading layer on the first semiconductor chip and including a hole, a first mold layer between the heat spreading layer and the redistribution structure and covering a sidewall of the first semiconductor chip, a shielding wall extending from the redistribution structure and the heat spreading layer and surrounding the first semiconductor chip, and a first conductive pillar extending from the redistribution structure into the hole.

DETAILED DESCRIPTION

Figure 1A:
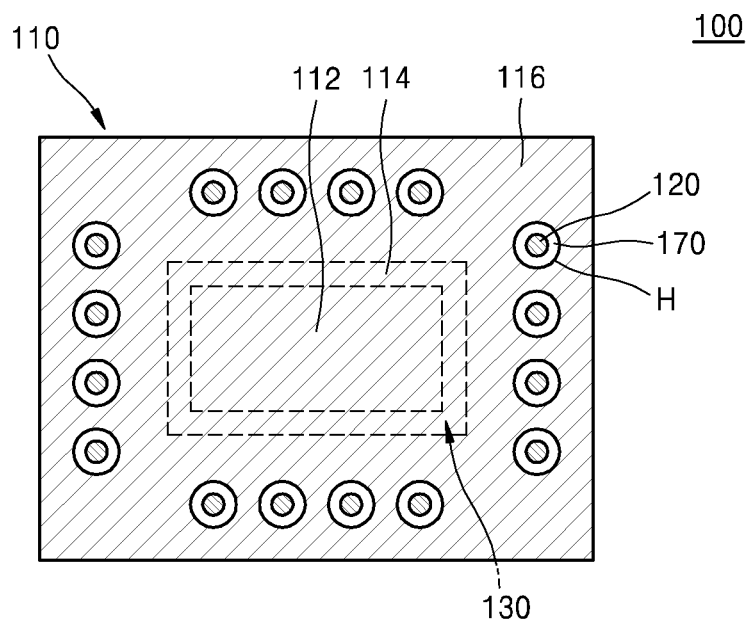
FIGS. 1A and 1B are a plan view and a cross-sectional view, respectively, illustrating a semiconductor package according to an example embodiment.

Various example embodiments will now be described more fully hereinafter with reference to the accompanying drawings. Like reference numerals may refer to like elements throughout this application.

Figure 1B:
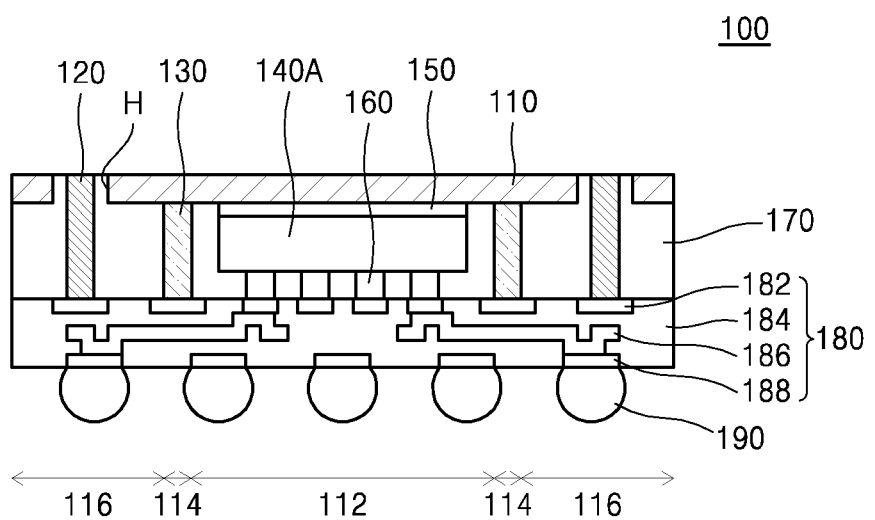

FIGS. 1A and 1B are a plan view and a cross-sectional view, respectively, illustrating a semiconductor package according to an example embodiment.

Referring to FIGS. 1A and 1B, a semiconductor package 100 may include a heat spreading layer 110, a first semiconductor chip 140A, a shielding wall 130, a first conductive pillar 120, a second conductive pillar 160, a first mold layer 170, a redistribution structure 180, and an outer terminal 190.

The heat spreading layer 110 may include a thermal and electrically conductive material. The heat spreading layer 110 may include, for example, Cu, Ni, Au, Ag, Al, or a combination thereof. In some embodiments, the heat spreading layer 110 may be formed of stacked layers. In some embodiments, the heat spreading layer 110 may include a laminate, such as a copper clad laminate (CCL).

The heat spreading layer 110 may include a chip portion 112, a shielding portion 114, and a hole portion 116. The chip portion 112 may be located in a central region of the heat spreading layer 110. The shielding portion 114 may surround the chip portion 112. The hole portion 116 may be located outside the shielding portion 114. The heat spreading layer 110 may include a hole H penetrating the heat spreading layer 110 in the hole portion 116. In some embodiments, the hole portion 116 may include a plurality of spaced holes H arranged along sides (e.g., peripheral areas) of the heat spreading layer 110.

The first semiconductor chip 140A may be disposed below the chip portion 112 of the heat spreading layer 110. The first semiconductor chip 140A may be, for example, a logic or memory chip. The logic chip may be, for example, a central processing unit (CPU), a controller, an application processor (AP), or an application specific integrated circuit (ASIC). The memory chip may be, for example, a dynamic random access memory (DRAM), a static random access memory (SRAM), a flash memory, an electrically erasable programmable read-only memory (EEPROM), a phase change memory (PRAM), a resistive random access memory (RRAM), or a magnetic random access memory (MRAM).

The first semiconductor chip 140A may be attached to an underside (e.g., a bottom surface) of the chip portion 112 of the heat spreading layer 110 by a chip adhesion layer 150 disposed between the first semiconductor chip 140A and the chip portion 112. The chip adhesion layer 150 may include, for example, a non-conductive adhesive, an anisotropic conductive adhesive, or an isotropic conductive adhesive. The non-conductive adhesive, the anisotropic conductive adhesive, and an isotropic conductive adhesive may be of a film or paste type. The non-conductive adhesive may include polymer resin. The anisotropic conductive adhesive and an isotropic conductive adhesive may include polymer resin and conductive particles. The conductive particles may include, for example, Ni, Au, Ag, and/or Cu. The polymer resin may include, for example, thermal curable resin, thermoplastic resin, and/or ultraviolet (UV) curable resin. The chip adhesion layer 150 may include, for example, epoxy resin, urethane resin, or acrylic resin.

The second conductive pillar 160 may be disposed below the first semiconductor chip 140A. The second conductive pillar 160 may be electrically connected to the first semiconductor chip 140A. The first semiconductor chip 140A may be electrically connected to the redistribution structure 180 via the second conductive pillar 160. The second conductive pillar 160 may include an electrically conductive material. For example, the second conductive pillar 160 may include metal (e.g., Cu, Ni, Al, Au, or Ag).

The shielding wall 130 may be disposed below the shielding portion 114 of the heat spreading layer 110. The shielding wall 130 may vertically extend from the shielding portion 114 of the heat spreading layer 110 to the redistribution structure 180. The shielding wall 130 may be spaced from first semiconductor chip 140A and (continuously) extend along an outer perimeter of the chip portion 112 to surround the first semiconductor chip 140A. A width of the shielding wall 130 may be about 5 μm to 100 μm. A height of the shielding wall 130 may be about 10 μm to 500 μm. The shielding wall 130 may be connected to the ground via the redistribution structure 180. The shielding wall 130 may function as a electromagnetic interference (EMI) shield and a heat transfer medium for transmitting heat generated at the redistribution structure 180 to the heat spreading layer 110. The shielding wall 130 may include metal (e.g., Cu, Al, Ni, Au, and/or Ag). The shielding wall 130 may include the same material as or a different material from the heat spreading layer 110.

The first conductive pillar 120 may contact the redistribution structure 180 and extend into the hole H of the heat spreading layer 110. A diameter of the first conductive pillar 120 may be smaller than a diameter of the hole H. A sidewall of the first conductive pillar 120 may be spaced from an inner sidewall of the hole H. An upper surface of the first conductive pillar 120 may be coplanar with an upper surface of the heat spreading layer 110. A height of the first conductive pillar 120 may be greater than the height of the shielding wall 130. A difference in the heights of the first conductive pillar 120 and the shielding wall 130 may be equal to a thickness of the heat spreading layer 110. The semiconductor package 100 may be connected to the same or different type of another semiconductor package via the first conductive pillar 120. The first conductive pillar 120 may include an electrically conductive material. The first conductive pillar 120 may include, for example, Cu, Ni, Al, Au, Ag, or a combination thereof. The first conductive pillar 120 and the shielding wall 130 may be made of the same material. In some embodiments, the first conductive pillar 120 and the shielding wall 130 may be made of different materials. An upper portion of the first conductive pillar 120 may include, for example, organic solderability preservative (OSP), Ni/Au, electroless nickel immersion gold (ENIG), or electroless nickel electroless palladium immersion gold (ENEPIG), to prevent or mitigate oxidation thereof.

A lower surface of the shielding wall 130, a lower surface of the first conductive pillar 120, and a lower surface of the second conductive pillar 160 may each be connected to the redistribution structure 180. The lower surface of the shielding wall 130, the lower surface of the first conductive pillar 120, and the lower surface of the second conductive pillar 160 may be coplanar. The redistribution structure 180 may include an upper pad 182, a redistribution pattern 186, a lower pad 188, and an insulating layer 184. The upper pad 182 may be disposed on an upper side (e.g., a top surface) of the redistribution structure 180 and be electrically connected to the shielding wall 130, the first conductive pillar 120, and/or the second conductive pillar 160. The lower pad 188 may be disposed on an underside of the redistribution structure 180 and be electrically connected to the outer terminal 190. The redistribution pattern 186 may connect the upper pad 182 to the lower pad 188. A shape or configuration of the redistribution pattern 186 is not limited to that shown in FIG. 1B, but may be variously modified. In some embodiments, the redistribution pattern 186 may be formed of a plurality of layers. The upper pad 182, the lower pad 188, and the redistribution pattern 186 may include an electrically conductive material, for example, Cu, Ni, Au, Ag, Al, W, Ti, Ta, TiN, or a combination thereof. The insulating layer 184 may include, for example, an organic insulating material (e.g., polyimide, polybenzoxazole (PBO), or benzocyclobutene (BCB)), or an inorganic insulating material (e.g., silicon nitride, silicon oxynitride, or silicon oxide).

The first mold layer 170 may fill a space between the redistribution structure 180 and the heat spreading layer 110. The first mold layer 170 may cover at least a sidewall of the first semiconductor chip 140A, a sidewall of the shielding wall 130, and a sidewall of the second conductive pillar 160. The first mold layer 170 may fill the hole H. The first mold layer 170 may fill a gap between the inner sidewall of the hole H and a sidewall of the first conductive pillar 120. Thus, the first conductive pillar 120 and the heat spreading layer 110 may be separated from each other with the first mold layer 170 disposed therebetween. An upper surface of a portion of the first mold layer 170 filling the hole H, the upper surface of the first conductive pillar 120, and the upper surface of the heat spreading layer 110 may be coplanar. The first mold layer 170 may include, for example, thermally curable resin, thermoplastic resin, or UV curable resin. The first mold layer 170 may include, for example, epoxy resin (e.g., epoxy mold compound (EMC)) or silicone resin.

The outer terminal 190 may be disposed below the redistribution structure 180. The outer terminal 190 may be connected to the lower pad 188 of the redistribution structure 180. The outer terminal 190 may include a bump, such as a metal bump or a solder bump. The metal bump may include an electrical conductive material (e.g., Cu, Al, and/or Au). The solder bump may include, for example, Sn/Pb or Sn/Ag/Cu. Although not shown, the outer terminal 190 may further include an under bump metal pattern disposed between the bump and the lower pad 188 of the redistribution structure 180. The under bump metal pattern may include metal (e.g., Cr, W, Ti, Cu, Ni, Al, Pd, and/or Au).

According to an example embodiment of the inventive concepts, because the shielding wall 130 and the heat spreading layer 110 cover the first semiconductor chip 140A, the first semiconductor chip 140A may be shielded from electromagnetic interference (EMI). Additionally, heat generated from the first semiconductor chip 140A and/or the redistribution structure 180 may be transmitted to the heat spreading layer 110 having a lager plane area, such that the semiconductor package 100 may have an enhanced heat dissipation performance.

The heat spreading layer 110 may be formed to have the plane area occupying or covering most of or an entirety of a plane area of the semiconductor package 100. For example, an upper surface of the first mold layer 170 except for the portion filling the hole H may be covered by the heat spreading layer 110. A plane area of the redistribution structure 180 may be substantially equal to a sum of the plane area of the heat spreading layer 110 and a plane area of the hole H. The semiconductor package 100 may have the enhanced heat dissipation property by the heat spreading layer 110 having the larger plane area.

Furthermore, because the heat spreading layer 110 and the redistribution structure 180 are disposed at the upper portion and lower portion, respectively, of the semiconductor package 100, the warpage of the semiconductor package 100, caused by a difference in coefficients of thermal expansion between elements of the semiconductor package 100, may be reduced or prevented. By adjusting a thickness and material of the heat spreading layer 110, the warpage of the semiconductor package 100 may be controlled.

Figure 2A:
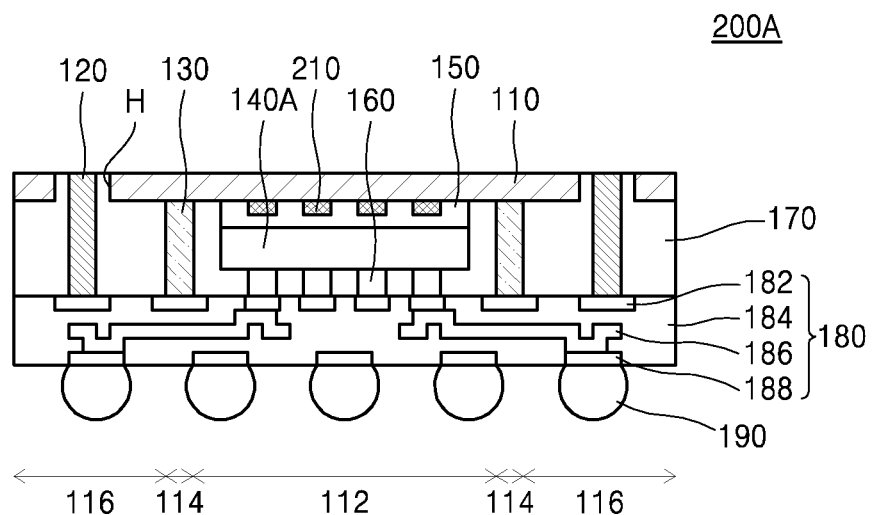
FIG. 2A is a cross-sectional view illustrating a semiconductor package according to an example embodiment.

FIG. 2A is a cross-sectional view illustrating a semiconductor package according to an example embodiment. Hereinafter, differences between a semiconductor package 200A according to the present example embodiment and the semiconductor package 100 according to the example embodiment described with reference to FIGS. 1A and 1B will be described.

Referring to FIG. 2A, the semiconductor package 200A may further include a third conductive pillar 210 disposed between the chip portion 112 of the heat spreading layer 110 and the first semiconductor chip 140A. The third conductive pillar 210 may extend from the chip portion 112 of the heat spreading layer 110 toward the first semiconductor chip 140A. A height of the third conductive pillar 210 may be smaller than the height of the first conductive pillar 120 and the height of the shielding wall 130. An upper surface of the third conductive pillar 210 may contact the chip portion 112 of the heat spreading layer 110. A lower surface of the third conductive pillar 210 may not contact the first semiconductor chip 140A. The chip adhesion layer 150 may be disposed between the first semiconductor chip 140A and the heat spreading layer 110 and between the first semiconductor chip 140A and the lower surface of the third conductive pillar 210. The third conductive pillar 210 may include an electrically and thermally conductive material. The third conductive pillar 210 may include, for example, Cu, Ni, Au, Ag, Al, or a combination thereof. Because the semiconductor package 200A includes the third conductive pillar 210, the heat generated from the first semiconductor chip 140A may be more rapidly transmitted to the heat spreading layer 110. For example, the heat generated from the first semiconductor chip 140A may be transmitted to the heat spreading layer 110 via a short thermal path of the chip adhesion layer 150 and the third conductive pillar 210 having the relatively high thermal conductivity. Thus, the semiconductor package 200A may have an enhanced heat dissipation performance.

Figure 2B:
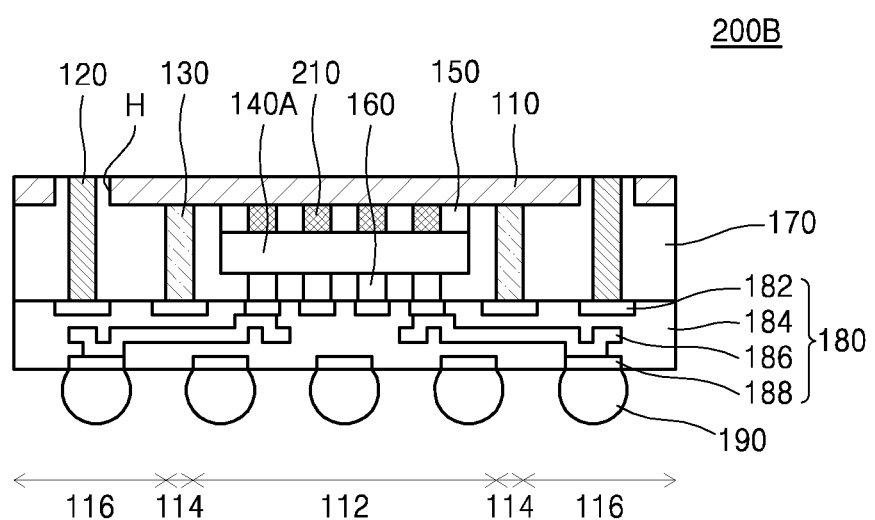
FIG. 2B is a cross-sectional view illustrating a semiconductor package according to an example embodiment.

FIG. 2B is a cross-sectional view illustrating a semiconductor package according to an example embodiment. Hereinafter, differences between a semiconductor package 200B according to the present example embodiment and the semiconductor package 200A according to the example embodiment described with reference to FIG. 2A will be described.

Referring to FIG. 2B, the lower surface of the third conductive pillar 210 may contact the first semiconductor chip 140A in the semiconductor package 200B. The heat generated from the first semiconductor chip 140A may be transmitted to the heat spreading layer 110 via the third conductive pillar 210 having relatively high thermal conductivity. Thus, the semiconductor package 200B may have an enhanced heat dissipation performance.

Figure 3A:
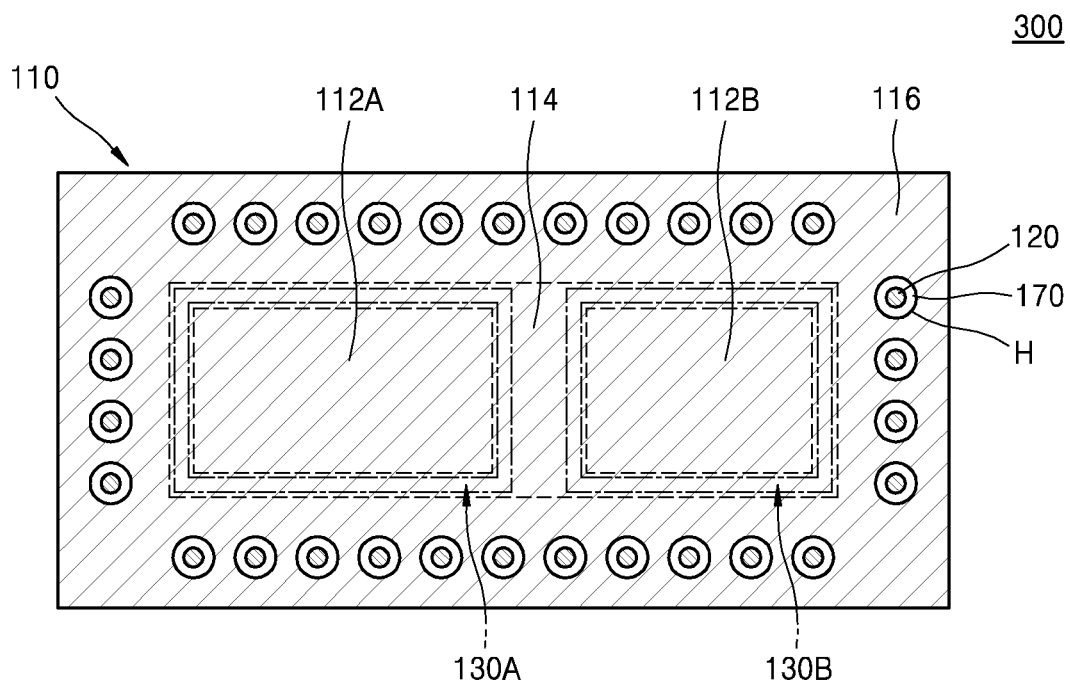
FIGS. 3A and 3B are a plan view and a cross-sectional view, respectively, illustrating a semiconductor package according to an example embodiment.
Figure 3B:
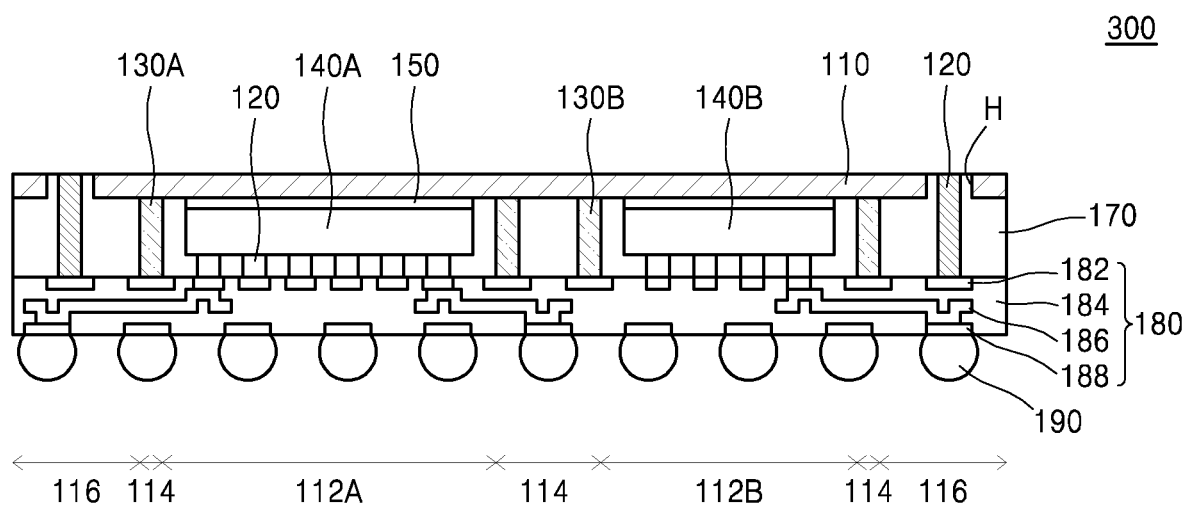

FIGS. 3A and 3B are a plan view and a cross-sectional view, respectively, illustrating a semiconductor package according to an example embodiment. Hereinafter, differences between a semiconductor package 300 according to the present example embodiment and the semiconductor package 100 according to the example embodiment described with reference to FIGS. 1A and 1B will be described.

Referring to FIGS. 3A and 3B, in the semiconductor package 300, the heat spreading layer 110 may include a plurality of laterally spaced chip portions 112A and 112B. The shielding portion 114 may surround the plurality of chip portions 112A and 112B. A plurality of semiconductor chips 140A and 140B may be disposed below the plurality of chip portions 112A and 112B, respectively. For example, referring to FIG. 3B, the heat spreading layer 110 may include a first chip portion 112A and a second chip portion 112B. The plurality of semiconductor chips 140A and 140B may include the first semiconductor chip 140A and a second semiconductor chip 140B. The first semiconductor chip 140A may be disposed below the first chip portion 112A of the heat spreading layer 110. The second semiconductor chip 140B may be disposed below the second chip portion 112B of the heat spreading layer 110. The first semiconductor chip 140A and the second semiconductor chip 140B may each be a memory or logic device. The first semiconductor chip 140A and the second semiconductor chip 140B may be of the same type or different types. A plurality of shielding walls 130A and 130B may be disposed below the shielding portion 114 of the heat spreading layer 110 and respectively surround the plurality of semiconductor chips 140A and 140B. The plurality of shielding walls 130A and 130B may include a first shielding wall 130A and a second shielding wall 130B. The first shielding wall 130A may surround the first semiconductor chip 140A. The second shielding wall 130B may surround the second semiconductor chip 140B. As the plurality of shielding walls 130A and 130B surround the plurality of semiconductor chips 140A and 140B, respectively, EMI that may be generated between the plurality of semiconductor chips 140A and 140B may be prevented or reduced. In some embodiments, the semiconductor package 300 may be of a system in package (SIP) type.

Figure 4A:
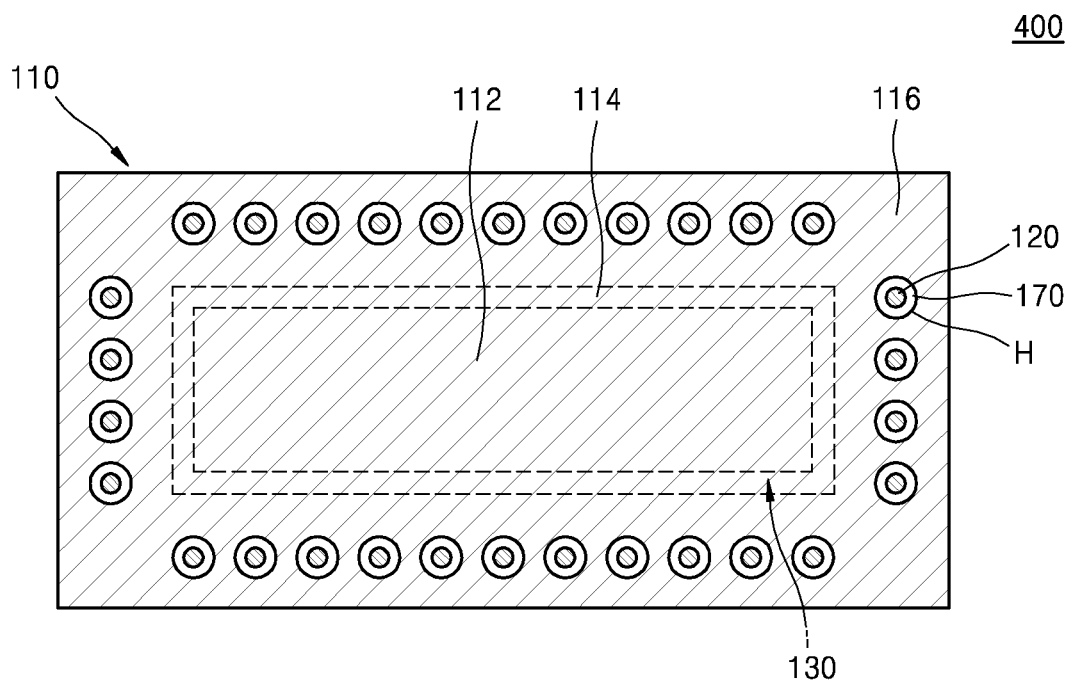
FIGS. 4A and 4B are a plan view and a cross-sectional view, respectively, illustrating a semiconductor package according to an example embodiment.
Figure 4B:
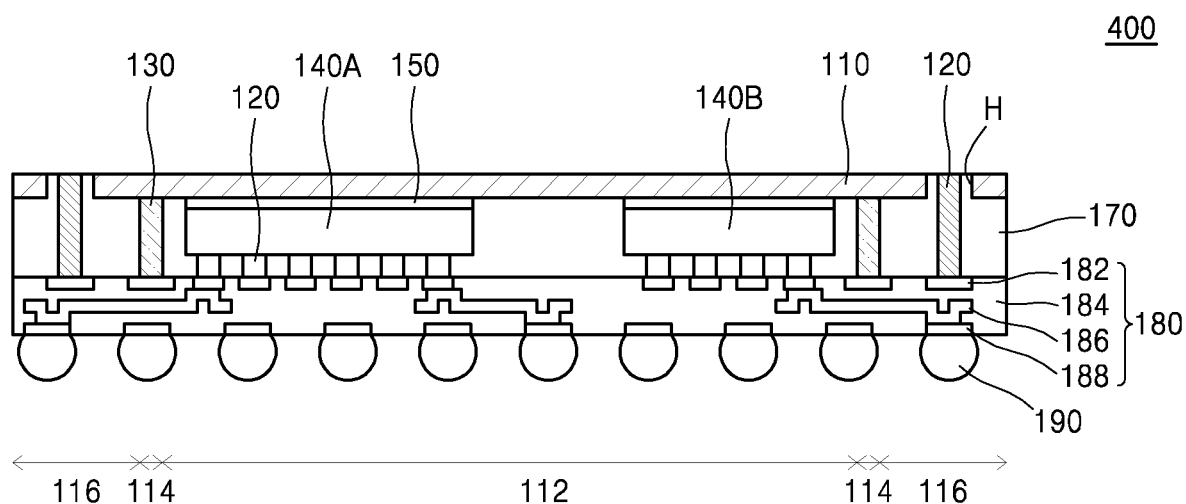

FIGS. 4A and 4B are a plan view and a cross-sectional view, respectively, illustrating a semiconductor package according to an example embodiment. Hereinafter, differences between a semiconductor package 400 according to the present example embodiment and the semiconductor package 300 according to the example embodiment described with reference to FIGS. 3A and 3B will be described.

Referring to FIGS. 4A and 4B, in the semiconductor package 400, the plurality of semiconductor chips 140A and 140B may be disposed below one chip portion 112 of the heat spreading layer 110. For example, the first semiconductor chip 140A and the second semiconductor chip 140B may be disposed below the one chip portion 112 of the heat spreading layer 110. One shielding wall 130 disposed below the shielding portion 114 of the heat spreading layer 110 may surround the plurality of semiconductor chips 140A and 140B.

Figure 5:
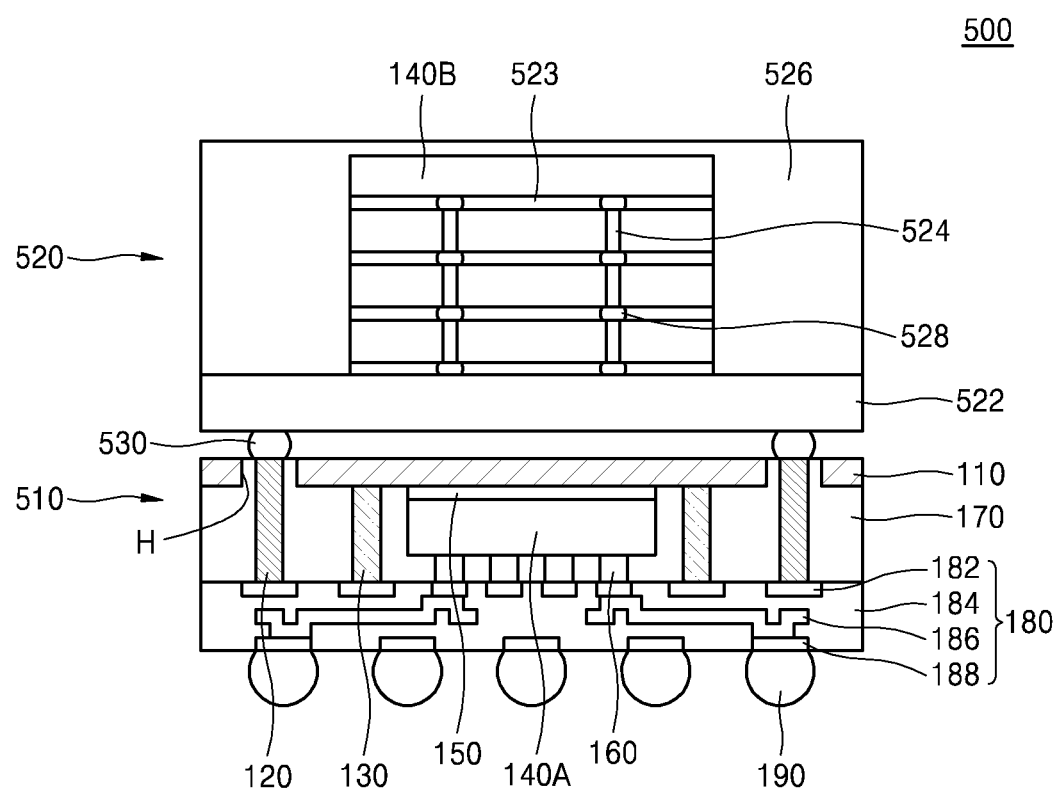
FIG. 5 is a cross-sectional view illustrating a semiconductor package according to an example embodiment.

FIG. 5 is a cross-sectional view illustrating a semiconductor package according to an example embodiment.

Referring to FIG. 5, a semiconductor package 500 may be of a package on package (POP) type. The semiconductor package 500 may include a first semiconductor package 510, a second semiconductor package 520 on the first semiconductor package 510, and an inter-package connection 530 between the first semiconductor package 510 and the second semiconductor package 520.

The first semiconductor package 510 may be one of the semiconductor packages 100, 200A, 200B, 300, or 400 described above. For example, the first semiconductor package 510 may include the redistribution structure 180, the outer terminal 190 below the redistribution structure 180, the first semiconductor chip 140A on the redistribution structure 180, the heat spreading layer 110 disposed on the first semiconductor chip 140A and having the hole H, the first mold layer 170 filling the space between the redistribution structure 180 and the heat spreading layer 110 and surrounding or covering the first semiconductor chip 140A, the shielding wall 130 extending from the redistribution structure 180 to the heat spreading layer 110 and covering or surrounding at least a sidewall of the first semiconductor chip 140A, and the first conductive pillar 120 extending from the redistribution structure 180 into the hole H of the heat spreading layer 110. Further, the first semiconductor package 510 may further include the chip adhesion layer 150 disposed between the heat spreading layer 110 and the first semiconductor chip 140A. In some embodiments, the first semiconductor package 510 may further include the third conductive pillar 210 between the heat spreading layer 110 and the first semiconductor chip 140A, shown in FIG. 2A or 2B.

The second semiconductor package 520 may be the same as or different from the first semiconductor package 510. The second semiconductor package 520 may include, for example, a second substrate 522, a plurality of second semiconductor chips 140B on the second substrate 522, and a second mold layer 526 covering the second semiconductor chips 140B.

The second mold layer 526 may protect the second semiconductor chips 140B from physical or chemical damage. The second mold layer 526 may include thermally curable resin, thermoplastic resin, and/or UV curable resin. The second mold layer 526 may include silicon resin or epoxy resin (e.g., EMC). The second substrate 522 may include, for example, silicon, glass, ceramic, or plastics.

The second semiconductor chips 140B may each be a memory or logic device. The second semiconductor chips 140B may be of the same type as or different types from the first semiconductor chip 140A. The number of the second semiconductor chips 140B may not be limited to the number of those shown in FIG. 5.

The adhesion layer 523 may be disposed between the second semiconductor chips 140B and between a lowermost one of the second semiconductor chips 140B and the second substrate 522 such that the second semiconductor chips 140B may be attached to each other and to the second substrate 522. The adhesion layer 523 may include, for example, thermally curable resin, thermoplastic resin, and/or UV curable resin. The adhesion layer 523 may include, for example, epoxy resin, urethane resin, or acrylic resin. The second semiconductor chips 140B may each include a through silicon via (TSV) 524 and an inner connection 528. The second semiconductor chips 140B and the second substrate 522 may be electrically connected via the TSV 524 and the inner connection 528. The TSV 524 and the inner connection 528 may include an electrically conductive material.

The structure of the second semiconductor package 520 may not be limited to that shown in FIG. 5. For example, the second semiconductor chips 140B may be connected to the second substrate 522 by a boding wire. In some embodiments, the second semiconductor package 520 may include one semiconductor chip. The one semiconductor chip and the second substrate 522 may be connected by a wire bonding method or a flip chip bonding method.

The inter-package connection 530 may electrically connect the first semiconductor package 510 to the second semiconductor package 520. The inter-package connection 530 may contact the first conductive pillar 120 and not contact the heat spreading layer 110. The inter-package connection 530 may include an electrically conductive material, for example, Al, Au, or solder.

As the semiconductor package 500 includes the shielding wall 130 and the heat spreading layer 110, EMI that may be generated between the first semiconductor chip 140A and the second semiconductor chips 140B may be prevented or reduced.

FIGS. 6A, 6C, 6E, 6G, 6I, 6K, and 6L are cross-sectional views illustrating a method of manufacturing semiconductor package according to an example embodiment. FIGS. 6B, 6D, 6F, 6H, and 6J are plan views illustrating the same method of manufacturing a semiconductor package according to the same example embodiment. FIGS. 6B, 6D, 6F, 6H, and 6J correspond to FIGS. 6A, 6C, 6E, 6G, 6I, respectively.

Figure 6A:
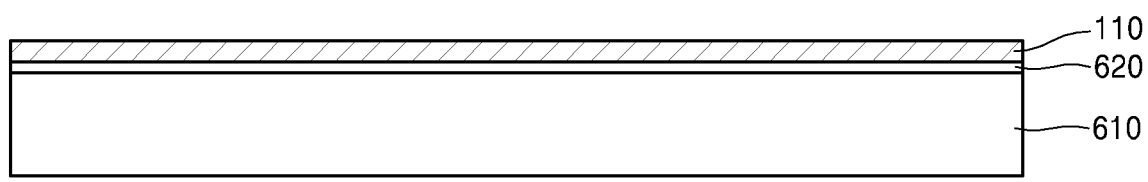
FIGS. 6A, 6C, 6E, 6G, 6I, 6K, and 6L are cross-sectional views illustrating a method of manufacturing semiconductor package according to an example embodiment.

Referring to FIG. 6A, a carrier adhesion layer 620 and the heat spreading layer 110 may be formed on a carrier 610. The carrier 610 may include, for example, glass, plastics, ceramic, or a semiconductor material (e.g., silicon or germanium). The carrier adhesion layer 620 may include, for example, thermally curable resin, thermoplastic resin, or UV curable resin. The carrier adhesion layer 620 may be an adhesive tape including acrylic resin or epoxy resin. In some embodiments, the heat spreading layer 110 may be formed by attaching copper clad laminate (CCL) to the carrier 610 using the carrier adhesion layer 620. When using the method of attaching the CCL, the heat spreading layer 110 that is relatively thick may be quickly formed on the carrier 610. Thus, the semiconductor package having improved EMI shielding effect may be manufactured, and its manufacturing time may be reduced.

Figure 6B:
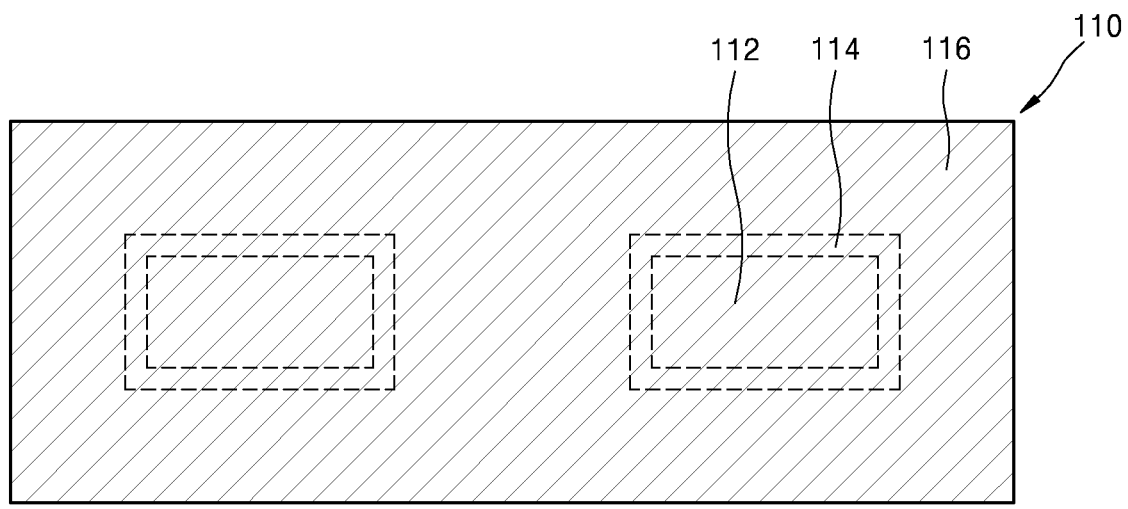
FIGS. 6B, 6D, 6F, 6H, and 6J are plan views illustrating a method of manufacturing a semiconductor package according to an example embodiment.

Referring to FIG. 6B, the heat spreading layer 110 may include the chip portion 112, the shielding portion 114, and the hole portion 116.

Figure 6C:
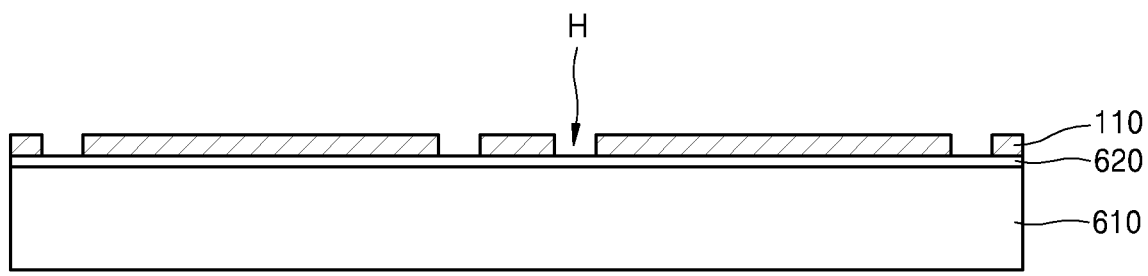
Figure 6D:
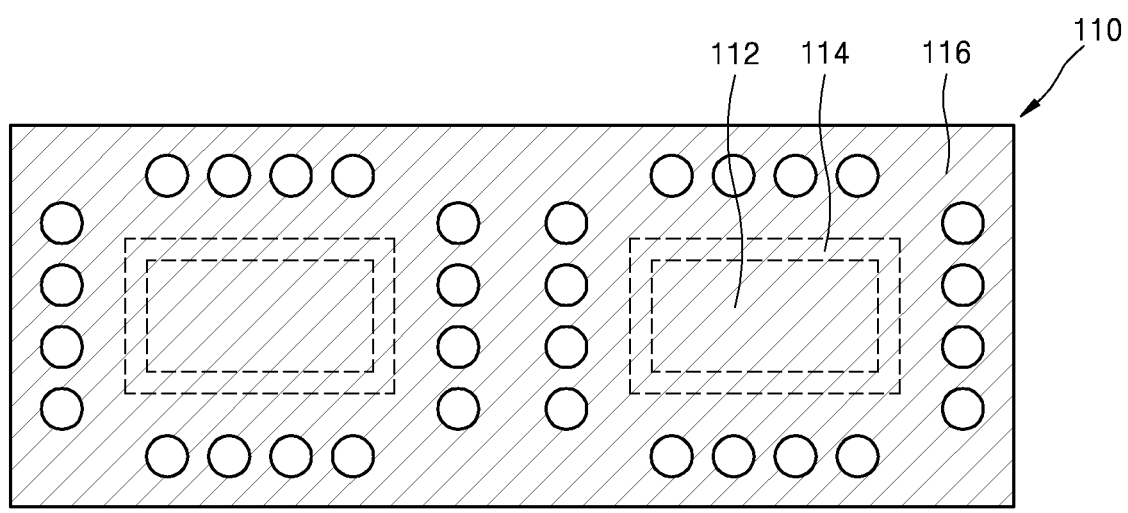

Referring to FIGS. 6C and 6D, the hole H may be formed in the hole portion 116 of the heat spreading layer 110. The hole H may be formed by a photolithography process. For example, the hole H may be formed by forming a photoresist pattern (not shown) on the heat spreading layer 110, etching the hole portion 116 of the heat spreading layer 110 exposed by the photoresist pattern, and removing the photoresist pattern. The heat spreading layer 110 may be etched by dry or wet etch. In some embodiments, the hole H may be formed by mechanical drilling.

In some embodiments, unlike those shown in FIGS. 6A to 6D, the hole H in the heat spreading layer 110 may be formed first, and then the heat spreading layer 110 including the hole H may be attached to the carrier adhesion layer 620.

In some embodiments, unlike those shown in FIGS. 6A to 6D, the heat spreading layer 110 including the hole H may be formed by a photolithography process and an electric plating process. For example, the heat spreading layer 110 including the hole H may be formed by forming a mask pattern on the carrier adhesion layer 620 by the photolithography process, and then forming a material layer on the resulting structure having the mask pattern by the electric plating process and removing the mask pattern.

Figure 6E:
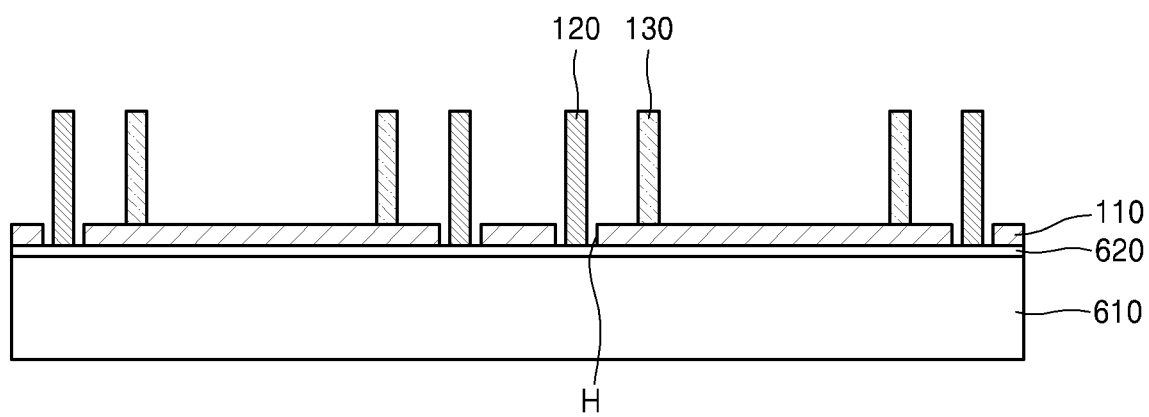
Figure 6F:
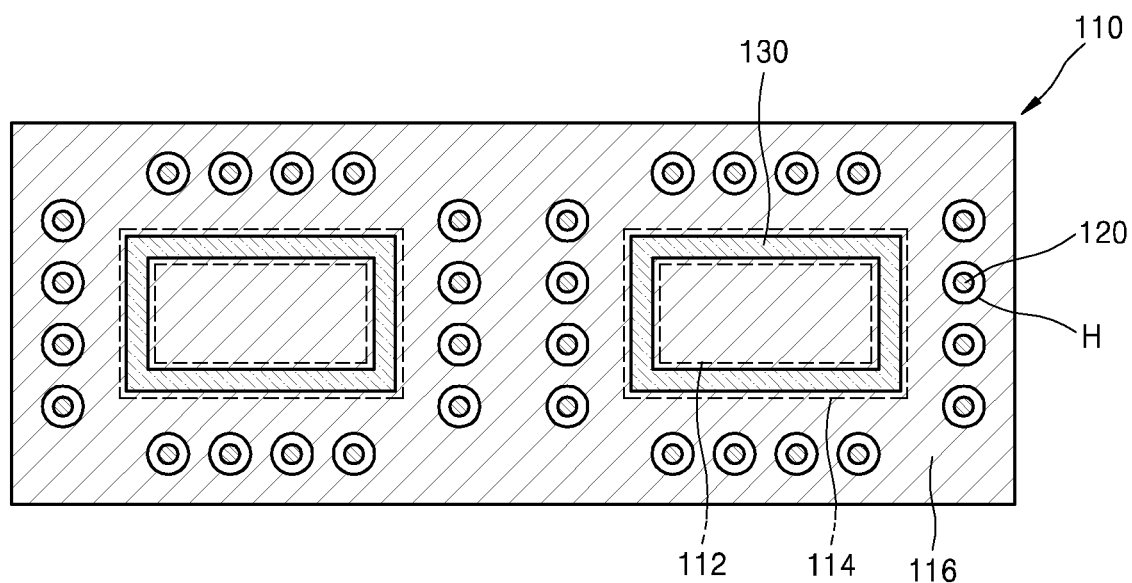

Referring to FIGS. 6E and 6F, the first conductive pillar 120 extending from the inside of the hole H and the shielding wall 130 extending from the shielding portion 114 of the heat spreading layer 110 may be formed. The first conductive pillar 120 and the shielding wall 130 may be formed at the same time. For example, the first conductive pillar 120 and the shielding wall 130 may be concurrently formed by forming a photoresist pattern on the heat spreading layer 110, forming a metal layer on the resulting structure having the photoresist pattern by an electric plating process, and removing the photoresist pattern. Because the first conductive pillar 120 and the shielding wall 130 may be concurrently formed, its manufacturing time and cost may be reduced.

Figure 6G:
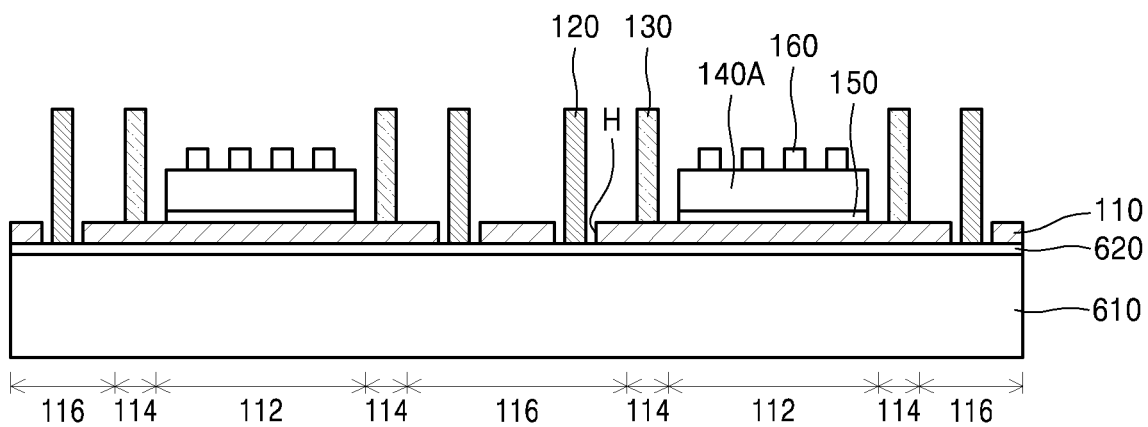
Figure 6H:
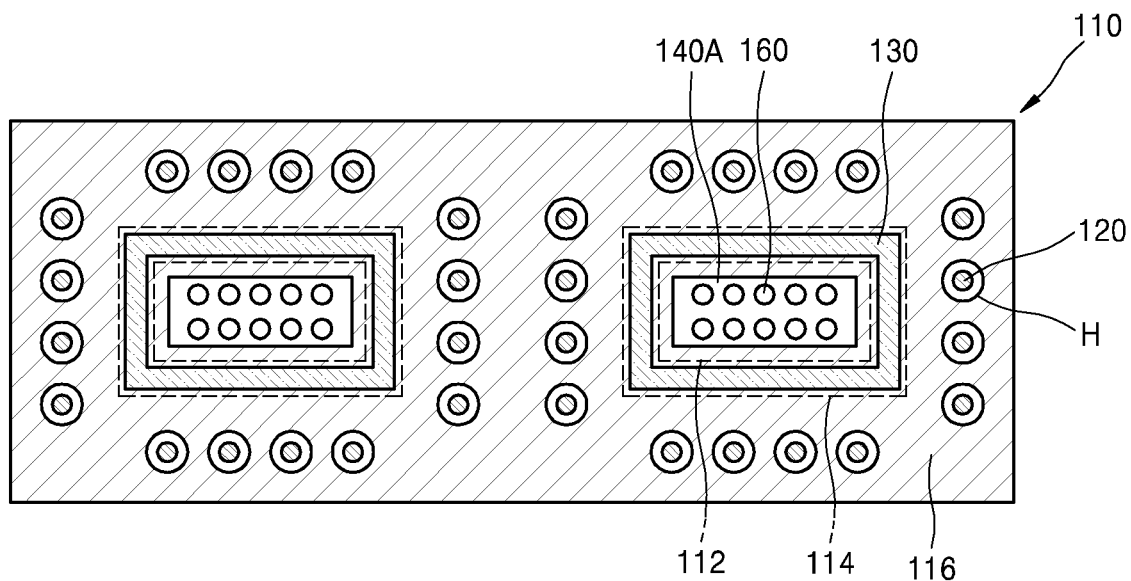

Referring to FIGS. 6G and 6H, the first semiconductor chip 140A having the second conductive pillar 160 connected thereto may be attached to the chip portion 112 of the heat spreading layer 110. To attach the first semiconductor chip 140A to the heat spreading layer 110, the chip adhesion layer 150 may be used.

Figure 6I:
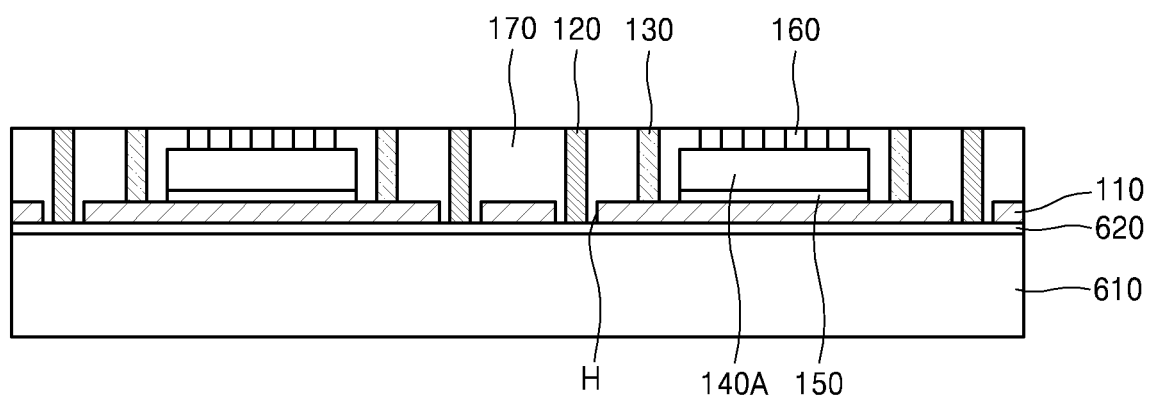
Figure 6J:
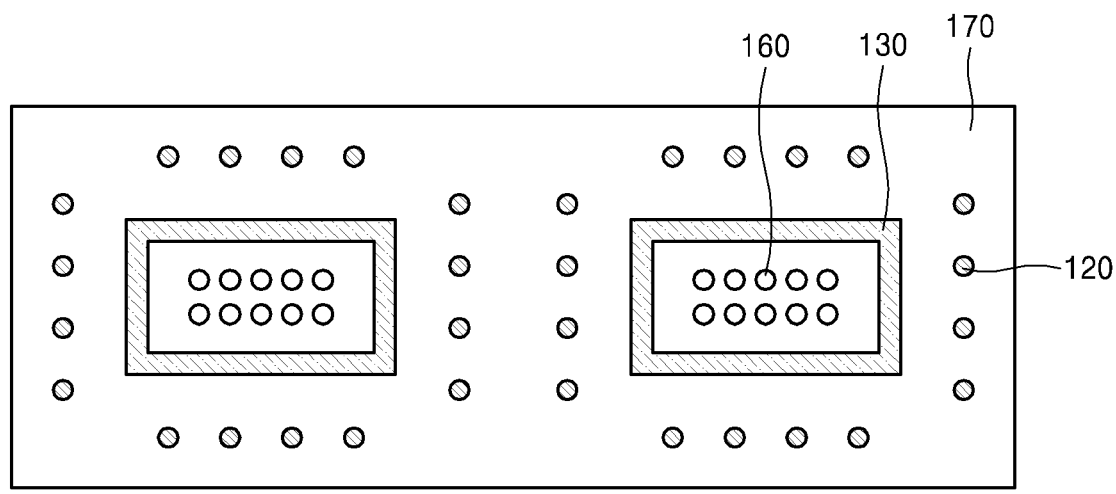

Referring to FIGS. 6I and 6J, the first mold layer 170 may be formed on the heat spreading layer 110 to encapsulate the first semiconductor chip 140A, the first conductive pillar 120, the shielding wall 130, and the second conductive pillar 160. The first mold layer 170 may fill the hole H to insulate the first conductive pillar 120 from an inner surface of the hole H. Thereafter, the first mold layer 170 may be ground to expose the first conductive pillar 120, the shielding wall 130, and the second conductive pillar 160.

Figure 6K:
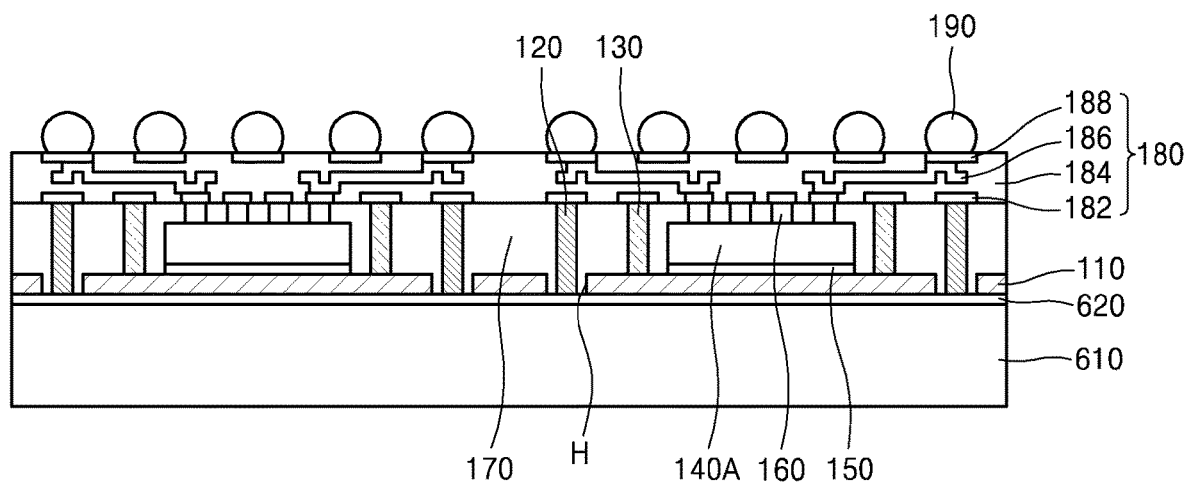

Referring to FIG. 6K, the redistribution structure 180 may be formed on the first mold layer 170. The outer terminal 190 may be formed on the redistribution structure 180. The redistribution structure 180 may include the insulating layer 184, the redistribution pattern 186, the upper pad 182, and the lower pad 188. The insulating layer 184 may be formed by, for example, a spin coating process, a physical vapor deposition process, or a chemical vapor deposition process, or an atomic layer deposition process. The redistribution pattern 186 may be formed by, for example, photolithography process and an electric plating process. The upper pad 182 and the lower pad 188 may be formed by, for example, a sputtering process or an electric plating process. The outer terminal 190 may be formed by, for example, attaching a solder ball on the lower pad 188 and performing a reflowing process.

Figure 6L:
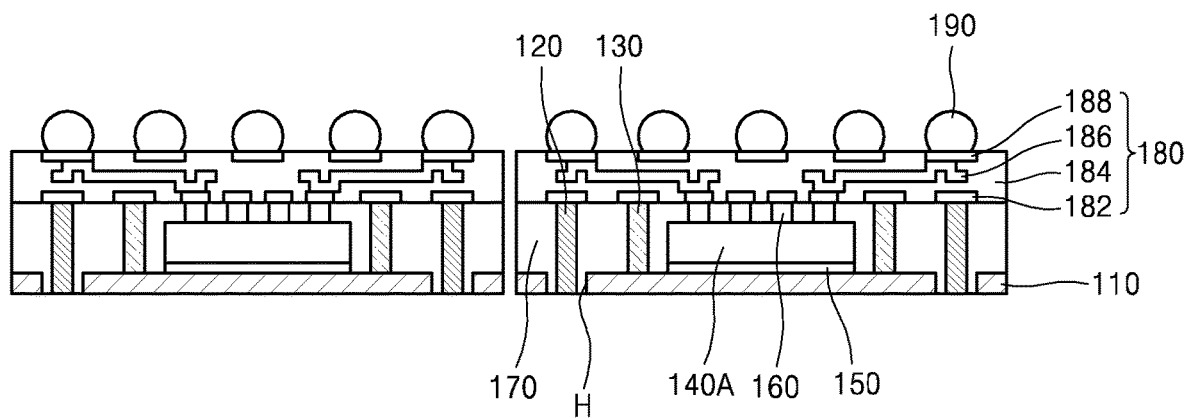

Referring to FIG. 6L, the carrier 610 and the carrier adhesion layer 620 may be removed. The carrier adhesion layer 620 may be removed along with the carrier 610 or separately removed. Thereafter, a cutting process may be performed such that the semiconductor package 100 shown in FIGS. 1A and 1B may be completed. The cutting process may include a sawing process or a laser cutting process.

Figure 7A:
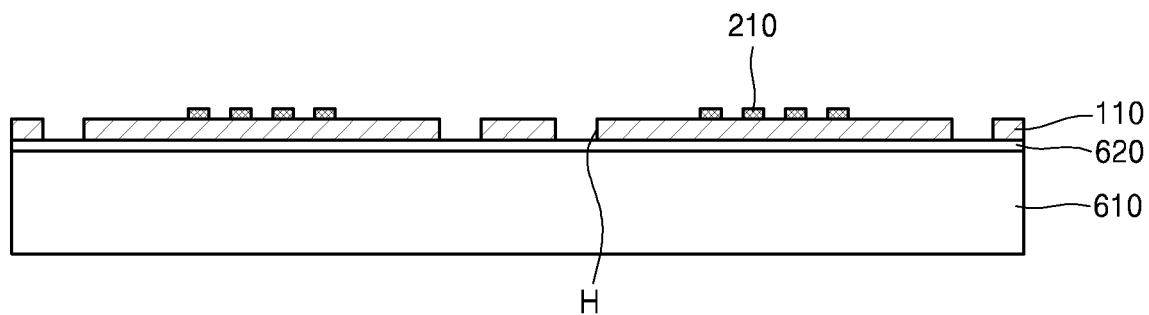
FIGS. 7A, 7B, and 7C are cross-sectional views illustrating a method of manufacturing semiconductor package according to an example embodiment.
Figure 7B:
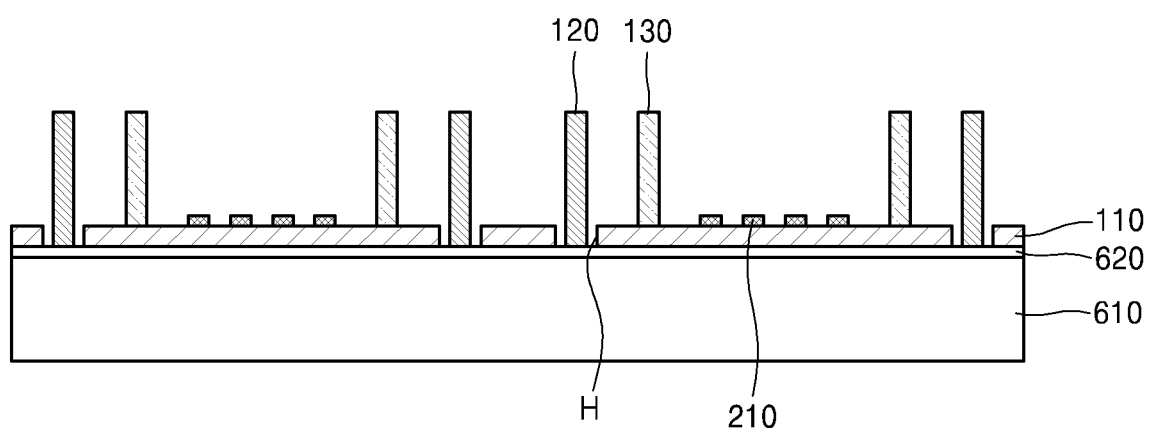
Figure 7C:
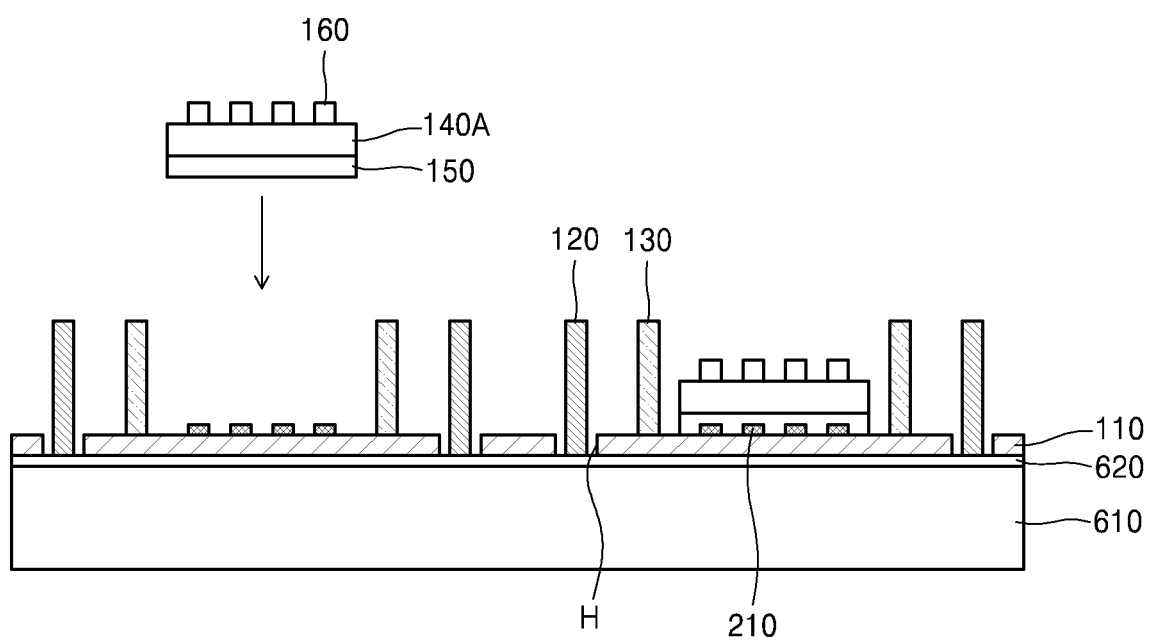

FIGS. 7A, 7B, and 7C are cross-sectional views illustrating a method of manufacturing semiconductor package according to an example embodiment. Hereinafter, differences between the present example embodiment and the example embodiment described with reference to FIG. 6A to 6I will be described.

Referring to FIG. 7A, after performing the same processes as described with reference to FIGS. 6A to 6D, the third conductive pillar 210 may be formed on the heat spreading layer 110. For example, the third conductive pillar 210 may be formed by forming a photoresist pattern on the heat spreading layer 110 to have an opening exposing a portion of the heat spreading layer 110, forming a conductive material layer on the resulting structure having the photoresist pattern by an electric plating process, and removing the photoresist pattern.

Referring to FIG. 7B, the first conductive pillar 120 extending from the inside of the hole H and the shielding wall 130 extending from the heat spreading layer 110 may be formed. For example, the first conductive pillar 120 and the shielding wall 130 may be concurrently formed by forming a photoresist pattern on the heat spreading layer 110 to have an opening exposing the hole H and another portion of the heat spreading layer 110, forming a conductive material layer on the resulting structure having the photoresist pattern by an electric plating process, and removing the photoresist pattern.

In some embodiments, the order of the process described with reference to FIG. 7A and the process described with reference to FIG. 7B may be inverted. For example, after forming the first conductive pillar 120 and the shielding wall 130 using a first photolithography process and a first electric plating process, the third conductive pillar 210 may be formed using a second photolithography process and a second electric plating process.

Referring to FIG. 7C, the first semiconductor chip 140A may be attached to the third conductive pillar 210 using the chip adhesion layer 150 coated on the first semiconductor chip 140A. The chip adhesion layer 150 may contact the heat spreading layer 110 by pressing the first semiconductor chip 140A. The chip adhesion layer 150 may or may not remain between the first semiconductor chip 140A and the third conductive pillar 210 depending on a pressing pressure against the first semiconductor chip 140A. In some embodiments, after coating the chip adhesion layer 150 on the third conductive pillar 210 and the heat spreading layer 110, the first semiconductor chip 140A may be attached to the third conductive pillar 210.

Thereafter, the same processes as described with reference to FIGS. 6I to 6L may be performed to complete the semiconductor package 200A or 200B shown in FIG. 2A or 2B.

Figure 8A:
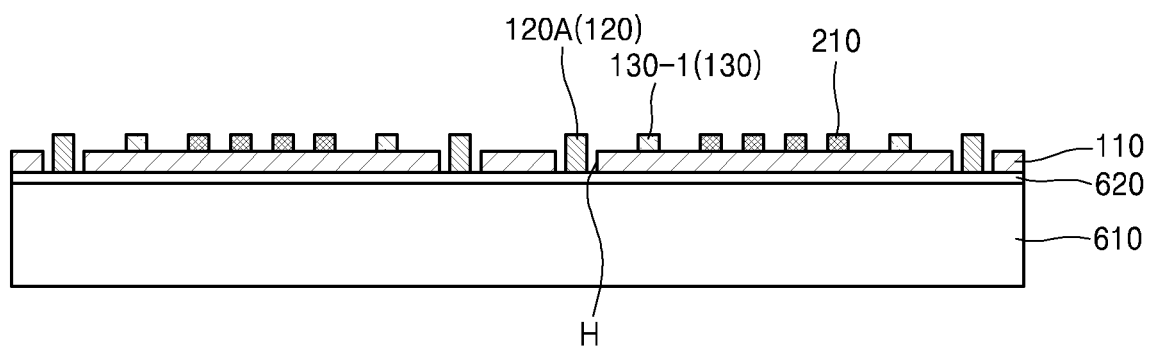
FIGS. 8A and 8B are cross-sectional views illustrating a method of manufacturing semiconductor package according to an example embodiment.
Figure 8B:
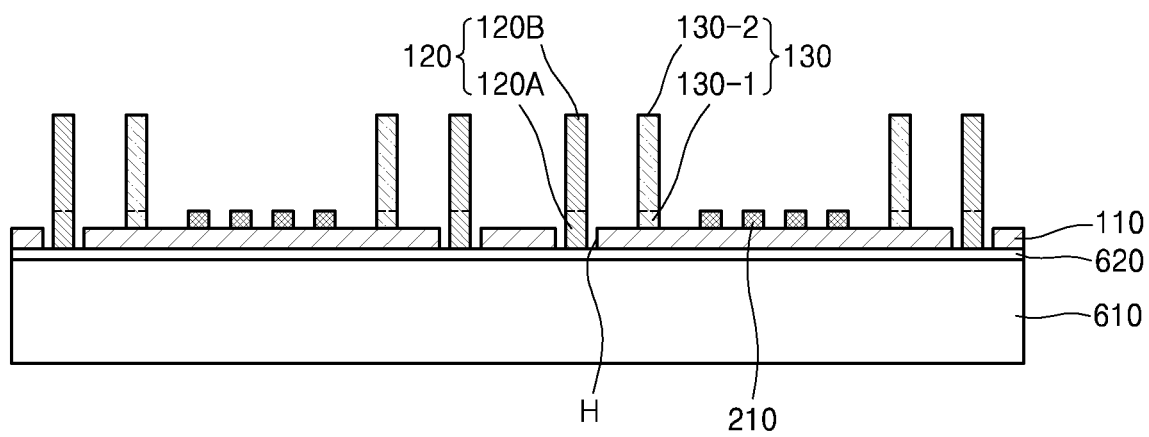

FIGS. 8A and 8B are cross-sectional views illustrating a method of manufacturing semiconductor package according to an example embodiment. Hereinafter, differences between the present example embodiment and the example embodiment described with reference to FIG. 7A to 7C will be described.

Referring to FIG. 8A, after performing the same processes as described with reference to FIGS. 6A to 6D, a first portion 120A of the first conductive pillar 120, a first portion 130-1 of the shielding wall 130, and the third conductive pillar 210 may be formed. The first portion 120A of the first conductive pillar 120, the first portion 130-1 of the shielding wall 130, and the third conductive pillar 210 may be concurrently formed by a first photolithography process and a first electric plating process.

Referring to FIG. 8B, a second portion 120B of the first conductive pillar 120 and a second portion 130-2 of the shielding wall 130 may be concurrently formed on the first portion 120A of the first conductive pillar 120 and the first portion 130-1 of the shielding wall 130, respectively, by a second photolithography process and a second electric plating process.

Thereafter, the same processes as described with reference to FIGS. 7C and 6I to 6L may be performed to complete the semiconductor packages 200A and 200B shown in FIG. 2A or 2B.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. A semiconductor package comprising:
a redistribution structure;
a first semiconductor chip on the redistribution structure;
a copper clad laminate on the first semiconductor chip;
a first mold layer between the copper clad laminate and the redistribution structure;
a shielding wall surrounding the first semiconductor chip;
a plurality of first conductive pillars around the shielding wall;
a plurality of inter-package connections on the plurality of first conductive pillars;
a substrate on the plurality of inter-package connections;
at least one second semiconductor chip on the substrate; and
a second mold layer covering the at least one second semiconductor chip.

2. The semiconductor package according to claim 1, wherein a height of the plurality of first conductive pillars is greater than a height of the shielding wall.

3. The semiconductor package according to claim 1, wherein the shielding wall extends between the redistribution structure and the copper clad laminate.

4. The semiconductor package according to claim 1, wherein upper surfaces of the plurality of first conductive pillars are coplanar with an upper surface of the copper clad laminate.

5. The semiconductor package according to claim 1, further comprising:
a plurality of second conductive pillars respectively extending from the redistribution structure to the first semiconductor chip.

6. The semiconductor package according to claim 5, wherein a lower surface of the shielding wall, lower surfaces of the plurality of first conductive pillars, and lower surfaces of the plurality of second conductive pillars are coplanar.

7. The semiconductor package according to claim 1, further comprising:
a chip adhesion layer between the copper clad laminate and the first semiconductor chip.

8. The semiconductor package according to claim 1, further comprising:
a plurality of third conductive pillars respectively extending from the copper clad laminate toward the first semiconductor chip.

9. The semiconductor package according to claim 8, further comprising:
a chip adhesion layer surrounding the plurality of third conductive pillars.

10. The semiconductor package according to claim 8, wherein at least one of the plurality of third conductive pillars contacts the first semiconductor chip.

11. A semiconductor package comprising:
a redistribution structure;
a first semiconductor chip on the redistribution structure;
a copper clad laminate on the first semiconductor chip;
a first mold layer between the copper clad laminate and the redistribution structure;
a shielding wall surrounding the first semiconductor chip;
a plurality of conductive bumps around the shielding wall, the plurality of conductive bumps vertically extending into respective holes of the copper clad laminate such that the plurality of conductive bumps are not electrically connected to the copper clad laminate;
a plurality of inter-package connections on the plurality of conductive bumps;
a substrate on the plurality of inter-package connections;
a plurality of second semiconductor chips on the substrate; and
a second mold layer covering the plurality of second semiconductor chips.

12. The semiconductor package according to claim 11, wherein the plurality of second semiconductor chips are vertically stacked on the substrate.

13. The semiconductor package according to claim 11, further comprising:
a plurality of through silicon vias (TSVs) in each of the plurality of second semiconductor chips.

14. The semiconductor package according to claim 11, further comprising:
a plurality of inner connections between the plurality of second semiconductor chips.

15. A semiconductor package comprising:
a first semiconductor package;
a second semiconductor package on the first semiconductor package; and a plurality of inter-package connections between the first semiconductor package and the second semiconductor package, wherein the first semiconductor package comprises, a copper clad laminate, a first semiconductor chip and a second semiconductor chip below the copper clad laminate, at least one shielding wall below the copper clad laminate, a plurality of first conductive pillars surrounding the at least one shielding wall, a first mold layer covering a sidewall of the at least one shielding wall, sidewalls of the plurality of first conductive pillars, a sidewall of the first semiconductor chip, and a sidewall of the second semiconductor chip, and a redistribution structure below the first semiconductor chip and the second semiconductor chip, and in contact with the at least one shielding wall, and the plurality of first conductive pillars.

16. The semiconductor package according to claim 15, wherein
the at least one shielding wall include only one shielding wall, and
the only one shielding wall surrounds the first semiconductor chip and the second semiconductor chip together.

17. The semiconductor package according to claim 15, wherein the at least one shielding wall include a first shielding wall surrounding the first semiconductor chip and a second shielding wall surrounding the second semiconductor chip.

18. The semiconductor package according to claim 17, wherein the plurality of first conductive pillars surround the first semiconductor chip and the second semiconductor chip together.

19. The semiconductor package according to claim 17, wherein the plurality of inter-package connections contact the plurality of first conductive pillars.

20. The semiconductor package according to claim 17, wherein the plurality of inter-package connections are spaced from the copper clad laminate.

* * * * *